(12) United States Patent
Zang

(10) Patent No.: US 9,412,659 B1
(45) Date of Patent: Aug. 9, 2016

(54) SEMICONDUCTOR STRUCTURE HAVING SOURCE/DRAIN GOUGING IMMUNITY

(71) Applicant: GLOBALFOUNDRIES Inc., Grand Cayman (KY)

(72) Inventor: Hui Zang, Guilderland, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 14/609,271

(22) Filed: Jan. 29, 2015

(51) Int. Cl.
  *H01L 29/76* (2006.01)
  *H01L 21/768* (2006.01)
  *H01L 23/535* (2006.01)

(52) U.S. Cl.
  CPC ........ *H01L 21/76897* (2013.01); *H01L 23/535* (2013.01)

(58) Field of Classification Search
  CPC ................................................. H01L 21/76897
  See application file for complete search history.

(56) References Cited

U.S. PATENT DOCUMENTS

| | | | | |
|---|---|---|---|---|
| 2011/0248355 A1* | 10/2011 | Futase | ............... | H01L 21/28052 257/383 |
| 2012/0146106 A1* | 6/2012 | Richter | ............. | H01L 21/28512 257/288 |
| 2014/0306291 A1* | 10/2014 | Alptekin | ........... | H01L 29/41725 257/369 |

* cited by examiner

*Primary Examiner* — David Vu
*Assistant Examiner* — Brandon Fox
(74) *Attorney, Agent, or Firm* — Heslin Rothenberg Farley and Mesiti PC; Nicholas Mesiti

(57) ABSTRACT

There is set forth herein a method of fabricating a semiconductor structure, the method including forming a conductive metal layer over a source/drain region. The conductive metal layer in one aspect can prevent gouging of a source/drain region during removal of materials above a source/drain region. The conductive metal layer in one aspect can be used to pattern an air spacer for reduced parasitic capacitance. The conductive metal layer in one aspect can reduce a contact resistance between a source/drain region and a contact above a source/drain region.

11 Claims, 9 Drawing Sheets

SEMICONDUCTOR STRUCTURE HAVING SOURCE/DRAIN GOUGING IMMUNITY

TECHNICAL FIELD

The present invention relates to semiconductor structure, and more particular a semiconductor structure having source/drain gouging immunity.

BACKGROUND

Different semiconductor structures may be fabricated to have one or more different device characteristics, such as switching speed, leakage power consumption, etc. Multiple different designs may each provide optimization of one or more of these characteristics for devices intended to perform specific functions. For instance, one design may increase switching speed for devices providing computational logic functions, and another design may decrease power consumption for devices providing memory storage functions. A system using multiple discrete devices optimized for different functions presents challenges in terms of system complexity, system footprint and cost.

One factor affecting performance of a semiconductor circuit is a quality of a source/drain region. Another factor affecting performance of a semiconductor circuit is parasitic capacitance including parasitic capacitance attributable to conductive gate layers. Another factor affecting performance of a semiconductor circuit is a resistance between a contact and a source/drain region. Another factor affecting performance of a semiconductor circuit is parasitic capacitance which can be attributable in part, e.g. to conductive gate material.

BRIEF DESCRIPTION

There is set forth herein a method of fabricating a semiconductor structure, the method including forming a conductive metal layer over a source/drain region. The conductive metal layer in one aspect can prevent gouging of a source/drain region during removal of materials above a source/drain region. The conductive metal layer in one aspect can reduce a contact resistance between a source/drain region and a contact above a source/drain region. The conductive metal layer in one aspect can be used to pattern an air spacer to reduce parasitic capacitance.

BRIEF DESCRIPTION OF THE SEVERAL VIEWS OF THE DRAWINGS

One or more aspects as set forth herein are particularly pointed out and distinctly claimed as examples in the claims at the conclusion of the specification. The foregoing and other objects, features, and advantages of the invention are apparent from the following detailed description taken in conjunction with the accompanying drawings in which:

DETAILED DESCRIPTION

Figure 1:
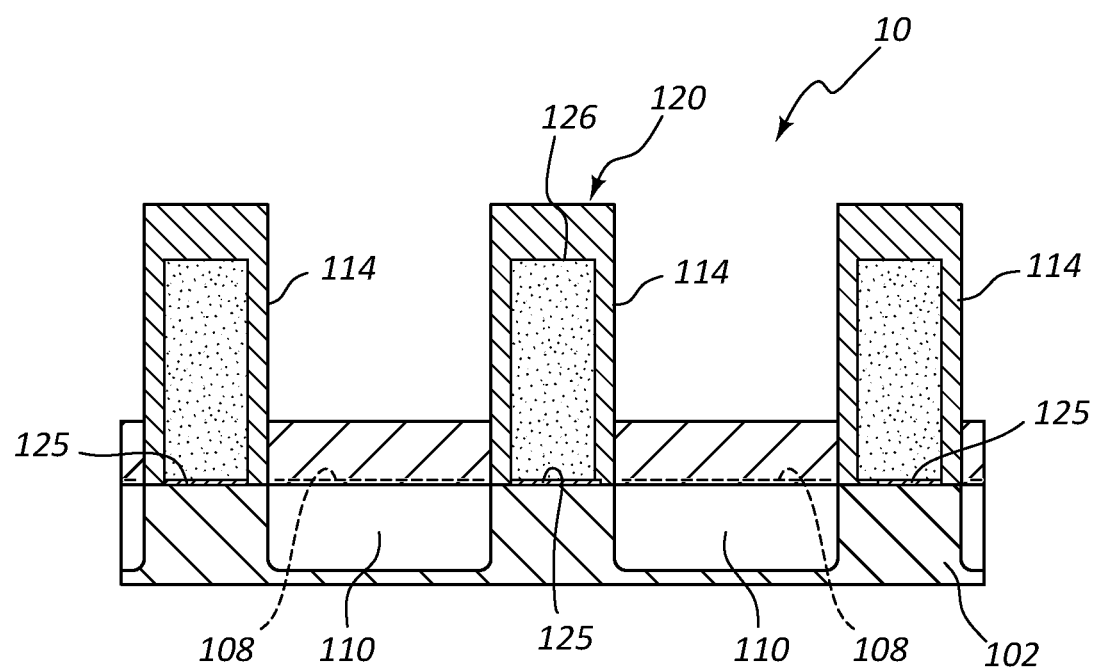
FIG. 1 is a cross sectional view of a semiconductor structure in an intermediary stage of fabrication.

Referring to FIG. 1, FIG. 1 semiconductor structure 10 shown in an intermediate fabrication stage can include a substrate 102, source/drain region 110, gate spacers 114, dielectric layer 125, and sacrificial polysilicon gate material formations 126, semiconductor structure 10 can also include source/drain regions 110.

Below a top elevation 108 of substrate 102 in one embodiment, source/drain regions 110 can be defined by doped areas of substrate 102. Above a top elevation 108 of substrate 102 source/drain regions 110 in one embodiment can be defined by epitaxially grown formations grown using epitaxially growth processes. Where semiconductor structure 10 is of a FinFET architecture, substrate 102 can be provided by a fin of semiconductor structure. Substrate 102 can alternatively be provided by a planar layer, e.g., a bulk layer or a thin layer e.g. in the case that semiconductor structure 10 is fabricated using a silicon on insulator (SOI) wafer.

In one embodiment, substrate 102 can be selectively recessed prior to formation of epitaxially grown formations of source/drain region 110. In such an embodiment, substantially any entirety of source/drain region 110 (areas both above elevation 108 and below elevation 108) can include epitaxially grown material.

In one embodiment source/drain regions 110 can be absent epitaxially grown formations and can be entirely defined below a top elevation 108 of substrate 102. In one embodiment, spacers 114 can be formed of nitride, e.g., silicon nitride (SiN). Dielectric layer 125 can be formed e.g., of silicon dioxide, $SiO_2$.

Figure 2:
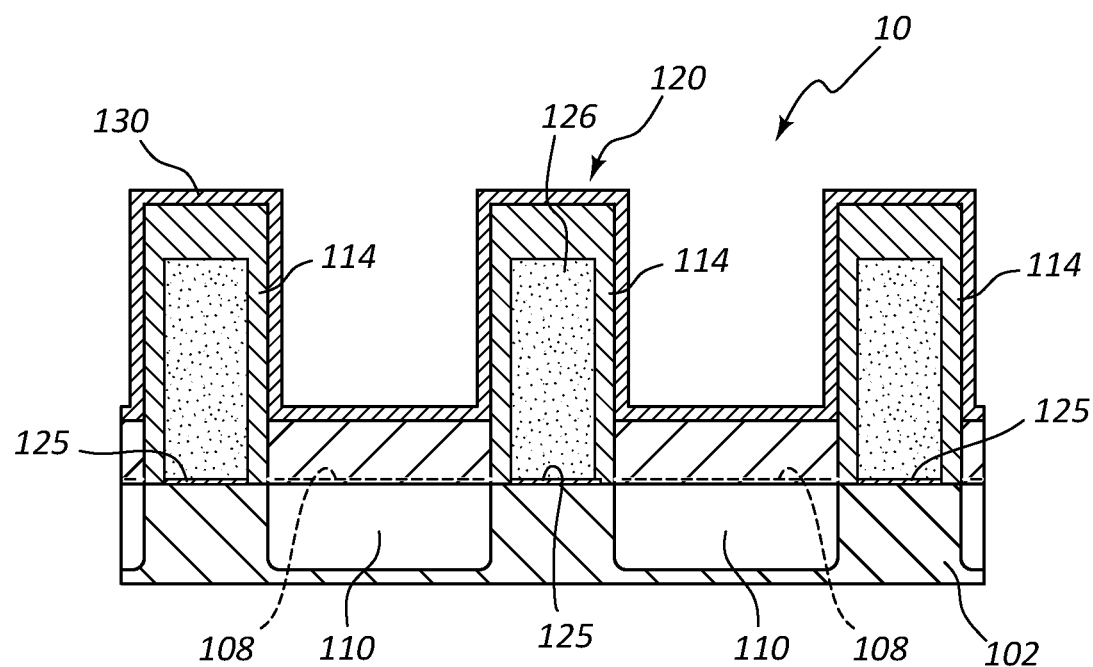
FIG. 2 is a cross sectional view of a semiconductor structure in an intermediary stage of fabrication after formation of a conductive metal layer.

Referring to FIG. 2, FIG. 2 illustrates the semiconductor structure 10 as shown in FIG. 1 after formation of layer 130. Layer 130 in one embodiment can be formed of metallic material. Layer 130 can be formed, e.g., of titanium (Ti), titanium nitride (TiN), tantalum nitride (TaN), titanium platinum (TiPt), cobalt (Co) or nickel platinum (NiPt). It was observed in the development of methods and apparatus herein that oxide can have improved etch selectively to metallic material relative to material of source/drain region, e.g., Si, SiGe. Accordingly, in one aspect as will be set forth herein, layer 130 can reduce a risk of gouging of source/drain region 110. In one aspect as set forth herein, layer 130 can be used to pattern air spacers. In another aspect, layer 130 can provide for a contact configuration having reduced contact resistance.

Figure 3:
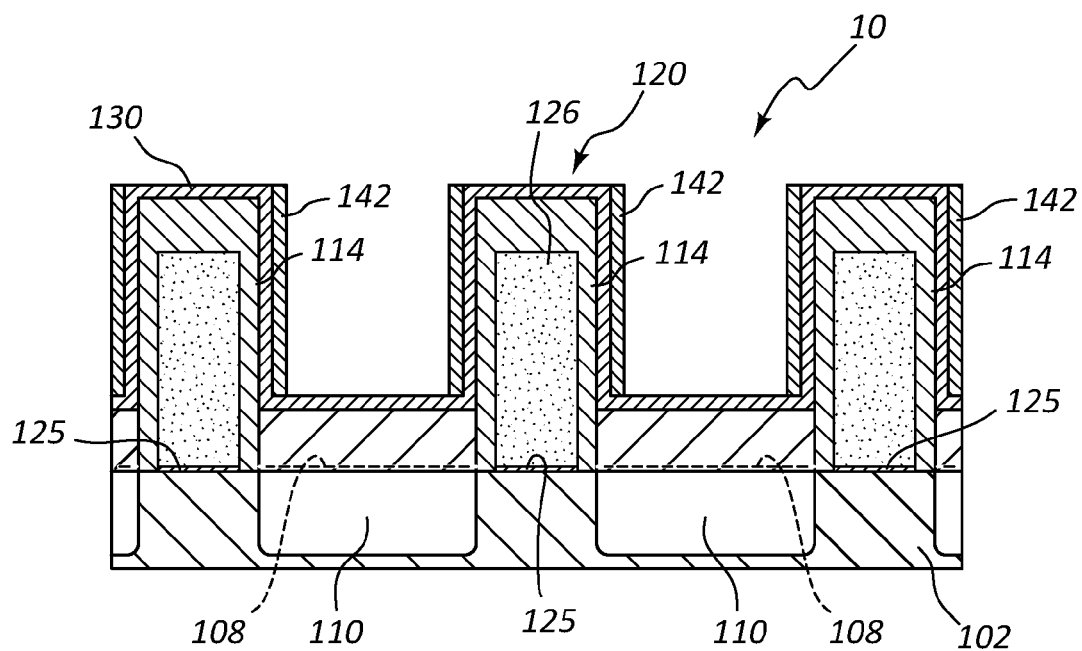
FIG. 3 is a cross sectional view of a semiconductor structure in an intermediary stage of fabrication after formation of wing spacers.

Referring to FIG. 3, FIG. 3 illustrates the semiconductor structure 10 of FIG. 2 after formation of wing spacers 142. Wing spacers 142 can be formed of a dielectric low K material such as a nitride, e.g., SiN. Wing spacers 142 can extend parallel to spacers 114 and can be separated from spacers 114 by vertically extending sections of layer 130.

Figure 4:
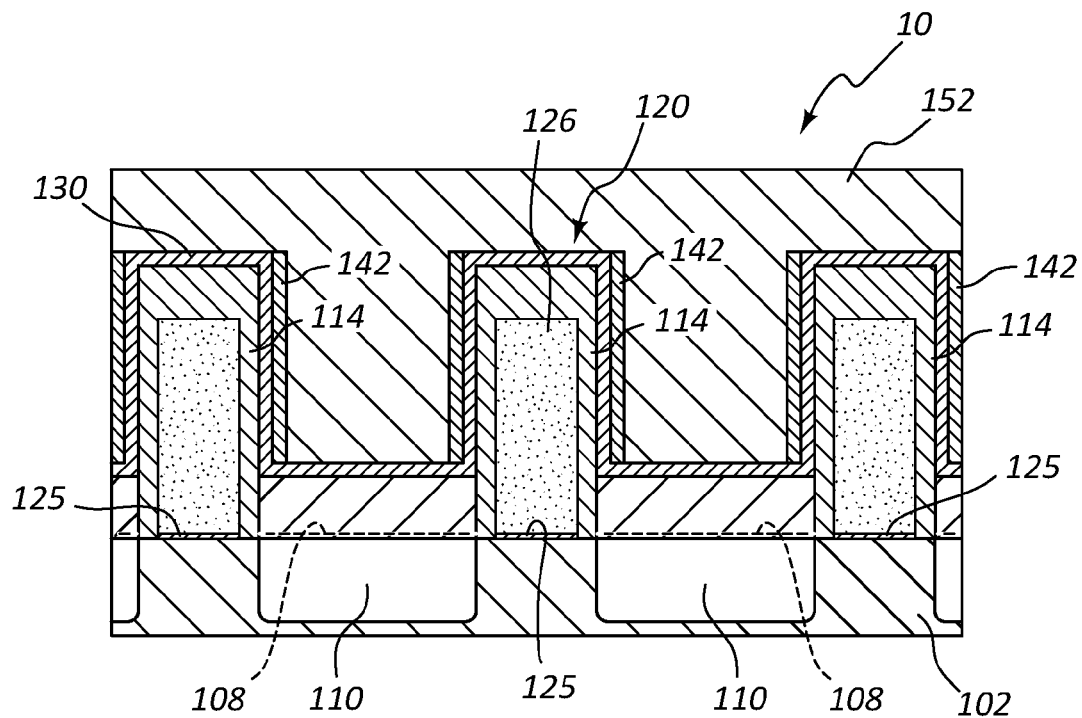
FIG. 4 is a cross sectional view of a semiconductor structure in an intermediary stage of fabrication after formation of a layer which can include oxide.

Referring to FIG. 4, FIG. 4 illustrates the semiconductor structure 10 as shown in FIG. 3 after formation of layer 152. Layer 152 in one embodiment can be provided by a dielectric material, e.g., an oxide.

Figure 5:
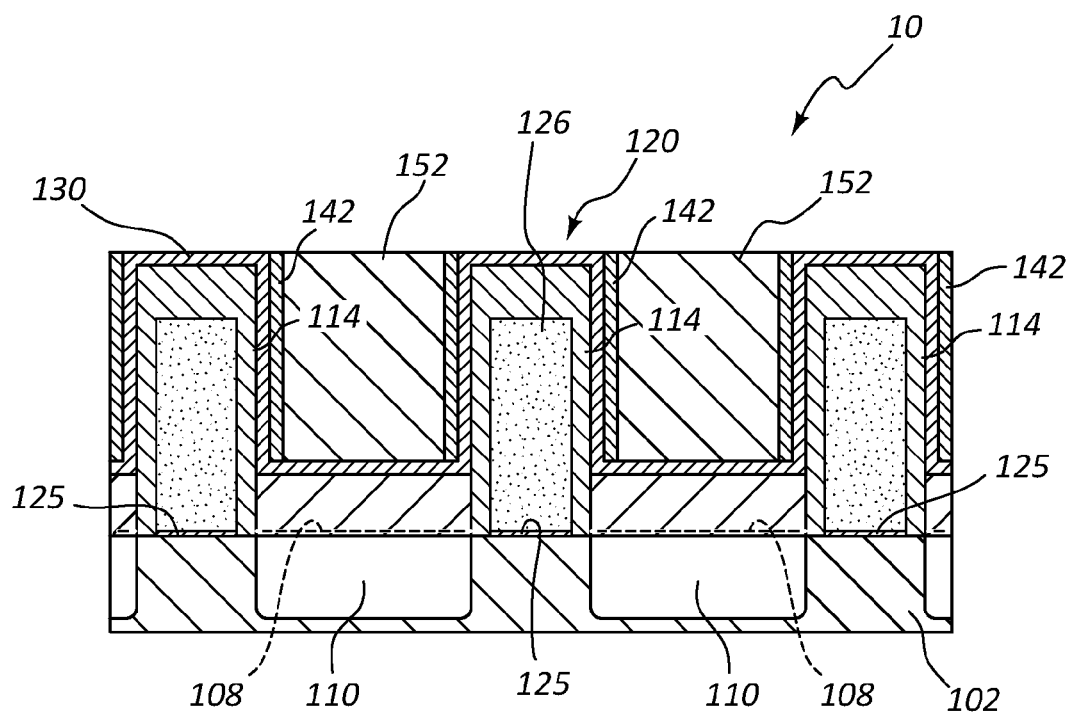
FIG. 5 is a cross sectional view of a semiconductor structure in an intermediary stage of fabrication after planarization of the semiconductor structure shown in FIG. 4.

Referring to FIG. 5, FIG. 5 illustrates the semiconductor structure 10 as shown in FIG. 4 after planarizing of layer 152. With planarizing of layer 152 complete as shown in FIG. 5 the top elevation of layer 152 can be lowered to a top elevation of layer 130. Referring to the intermediary fabrication stage views of FIGS. 1-5, it is seen that spacers 114 of semiconductor structure 10 in the intermediary fabrication stage views of FIGS. 1-5 can define a capping area therebetween.

Figure 6:
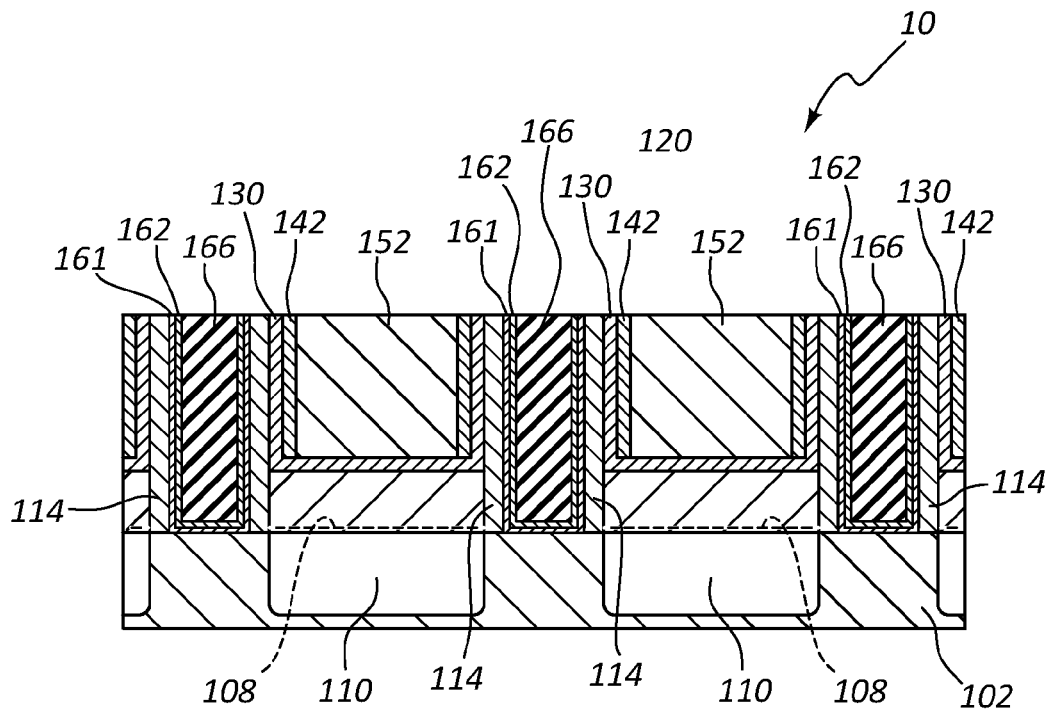
FIG. 6 is a cross sectional view of a semiconductor structure in an intermediary stage of fabrication after formation of gate layers.

Referring to FIG. 6, FIG. 6 illustrates the semiconductor structure 10 as shown in FIG. 5 after completion of a replacement metal gate process. According to a replacement metal gate process sacrificial polysilicon formation 126 (FIGS. 1-5) can be replaced with conductive gate material.

For replacement of sacrificial polysilicon formation 126 an opening above polysilicon formation 126 (FIG. 5) can be formed and formations 126 can be removed. Layer 161 which can be a high K layer can be formed and then layer 162 which can be a work function metallic layer can be formed over layer 161. A metal formation 166 e.g., formed of tungsten (W) can be formed over layer 161, and then semiconductor structure 10 can be subject to chemical mechanical planarization to define a planarized semiconductor structure 10 as set forth in FIG. 6.

Gates 120 in the intermediary fabrication stage views of FIGS. 1-5 can include layer 125 formed of dielectric material, polysilicon formation 126 and spacers 114. Gates 120 in the intermediary fabrication stage views of FIGS. 6-16 can include layer 161 formed of dielectric material, layer 162 formed of a work function material and spacers 114. Dielectric layer 161 can be e.g., a high K dielectric material, e.g., $HfO_2$.

Figure 7:
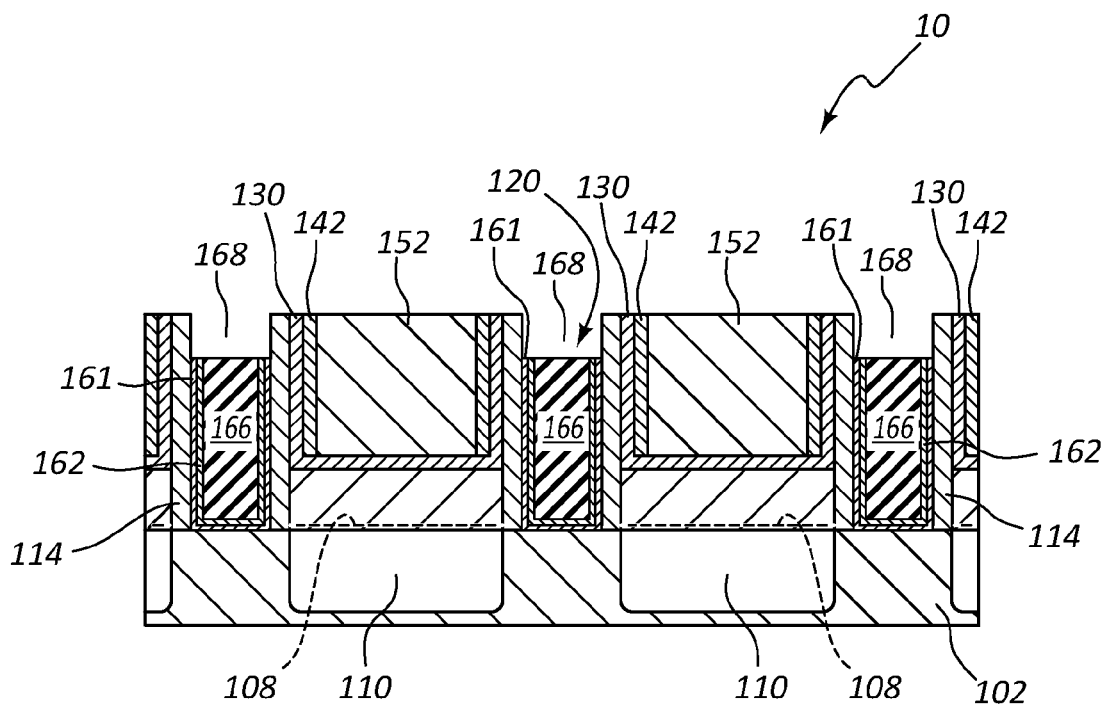
FIG. 7 is a cross sectional view of a semiconductor structure in an intermediary stage of fabrication after removal of material from a gate.

Referring to FIG. 7, FIG. 7 illustrates the semiconductor structure 10 as shown in FIG. 6 after removal of a portion of material of layer 161, layer 162, and layer 166 to define holes 168.

Figure 8:
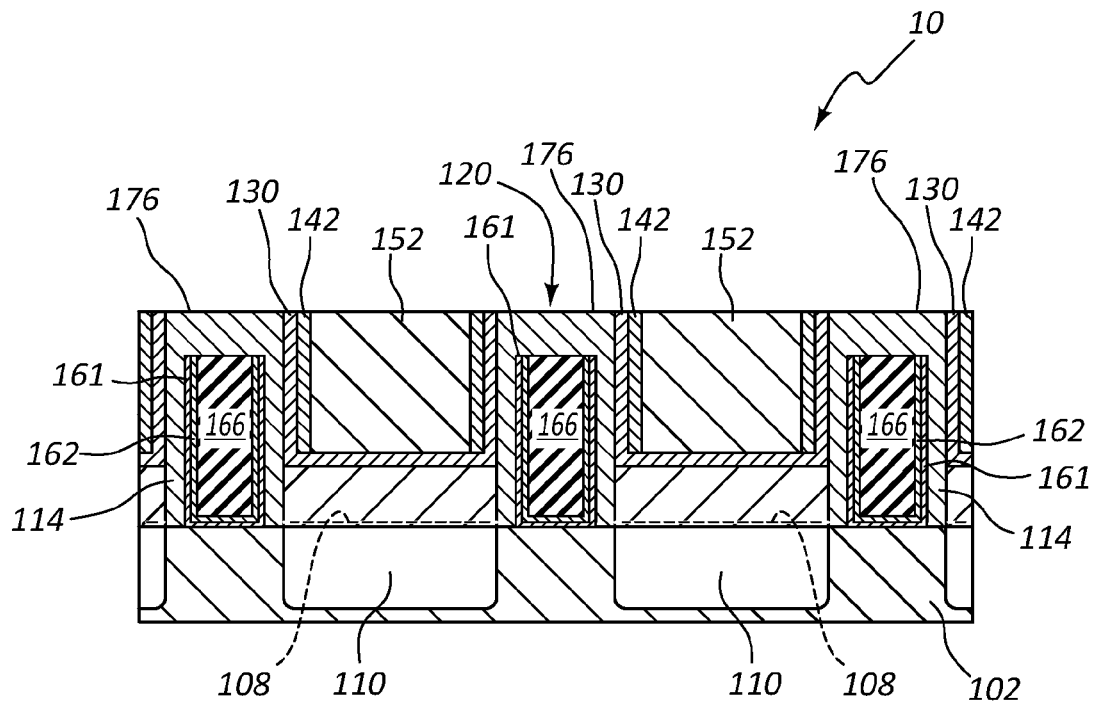
FIG. 8 is a cross sectional view of a semiconductor structure in an intermediary stage of fabrication after formation of a layer that can include a dielectric material.

Referring to FIG. 8, FIG. 8 illustrates the semiconductor structure 10 as shown in FIG. 7 after forming a layer 176 within holes 168. Layer 176 can be provided by a dielectric material. Layer 176 can be formed so that layer 176 can initially overfill holes 168 and then can be planarized.

Figure 9:
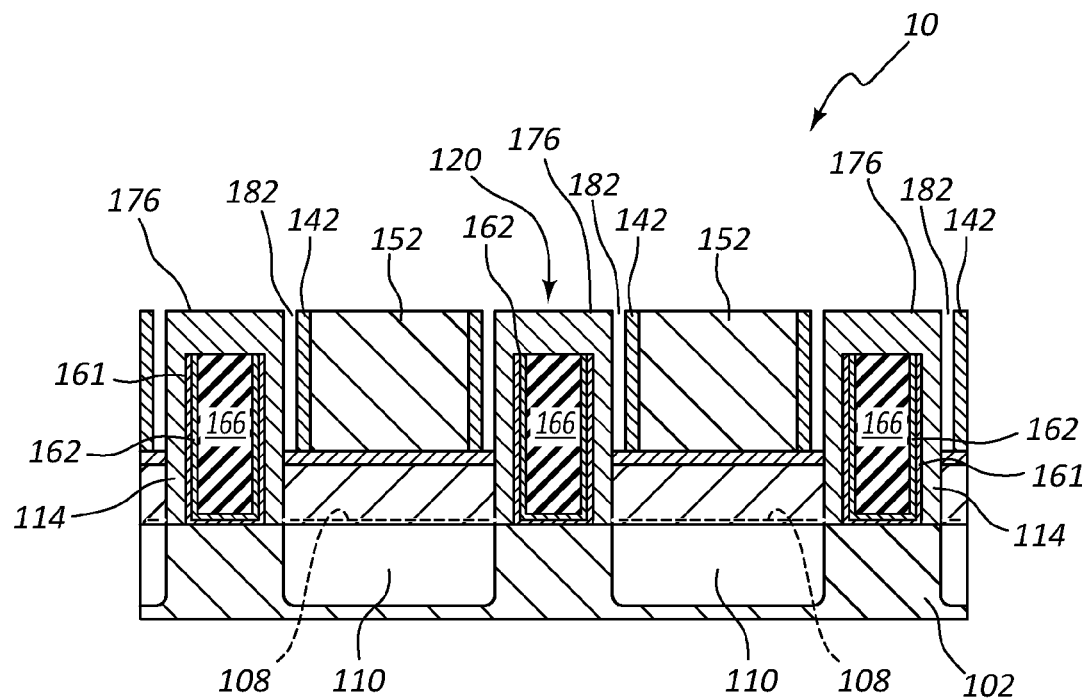
FIG. 9 is a cross sectional view of a semiconductor structure in an intermediary stage of fabrication after removal of material to define air spacers.

Referring to FIG. 9, FIG. 9 illustrates the semiconductor structure 10 as shown in FIG. 8 after removal of material from vertically extending sections of layer 130. Removal of vertically extending sections layer 130 can defined air spacers 182. Air spacers 182 can feature various advantages. For example, by virtue of their having a low dielectric constant, air spacers 182 can reduce a parasitic capacitance between a surface of a contact and a surface of a gate 120.

Figure 10:
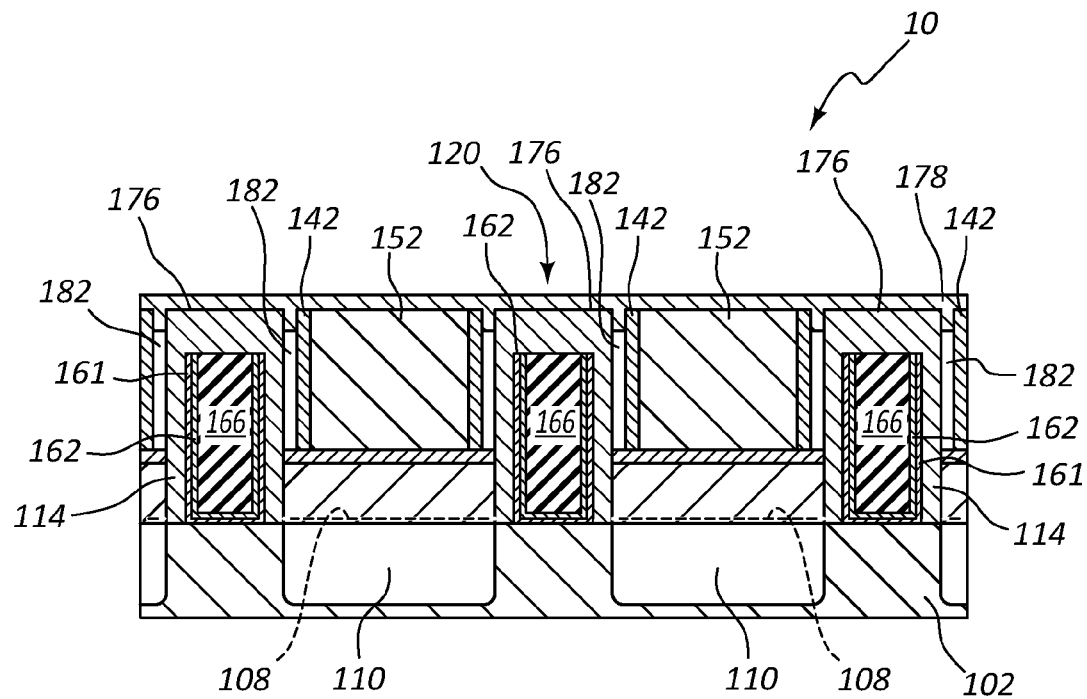
FIG. 10 is a cross sectional view of a semiconductor structure in an intermediary stage of fabrication after formation of a layer that can include oxide.

Referring to FIG. 10, FIG. 10 illustrates the semiconductor structure 10 as shown in FIG. 9 after a formation of additional layer 178 and layer 178 can be provided by dielectric material and can define a capping formation for air spacers 182.

Figure 11:
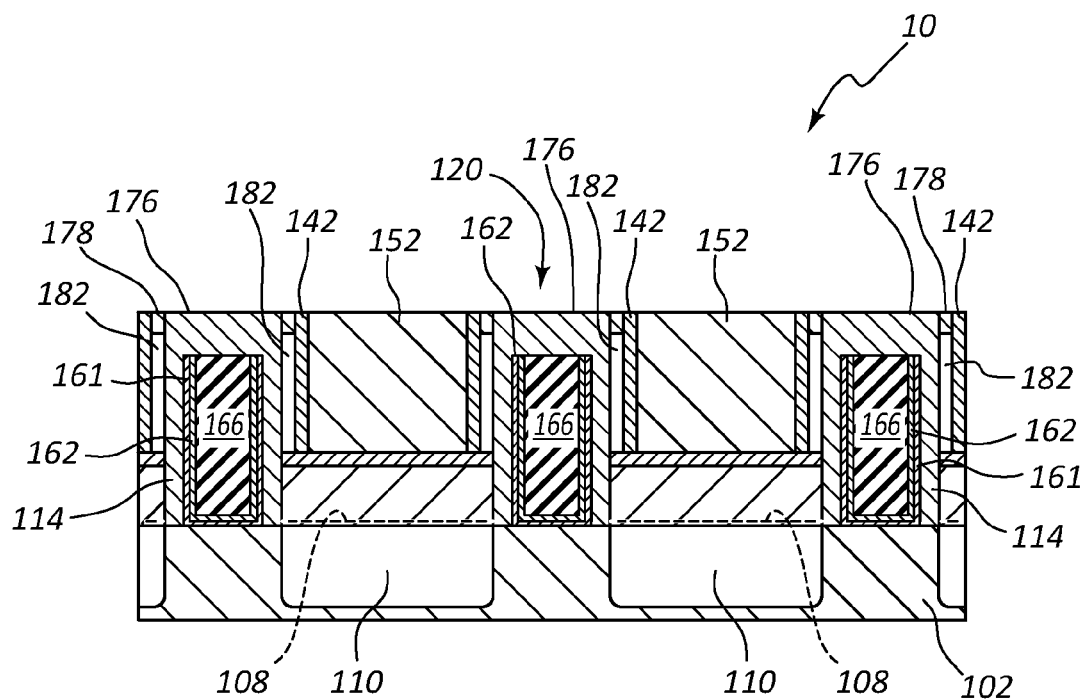
FIG. 11 is a cross sectional view of a semiconductor structure in an intermediary stage of fabrication after removal of material of the semiconductor structure depicted in FIG. 10.

Referring to FIG. 11, FIG. 11 illustrates the semiconductor structure 10 as shown in FIG. 10 after planarization to reduce an elevation of layer 176 and layer 178 so that a top elevation of layer 176 and a top elevation of layer 178 is co-planar with a top elevation of layer 152.

Figure 12:
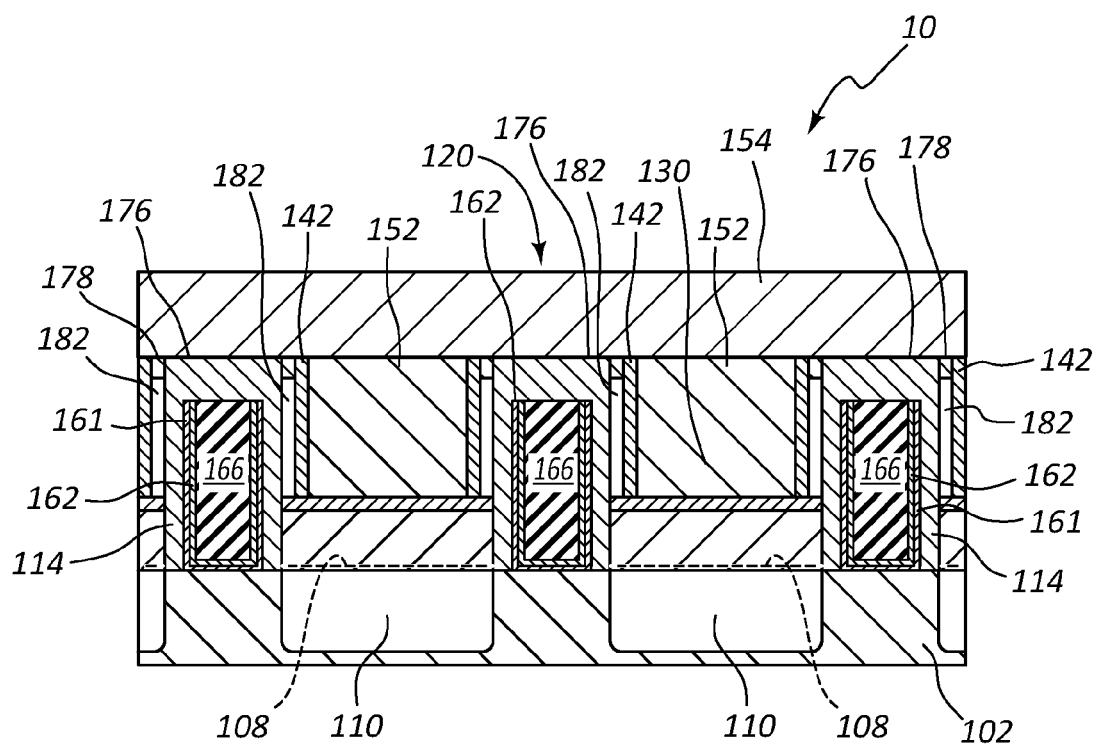
FIG. 12 is a cross sectional view of a semiconductor structure in an intermediary stage of fabrication after formation of a layer that can include oxide.

Referring to FIG. 12, FIG. 12 illustrates the semiconductor structure 10 as shown in FIG. 11 after formation of layer 154 over semiconductor structure 10. Layer 154 can be formed of dielectric material e.g., oxide and can be formed of the same material forming layer 152.

Figure 13:
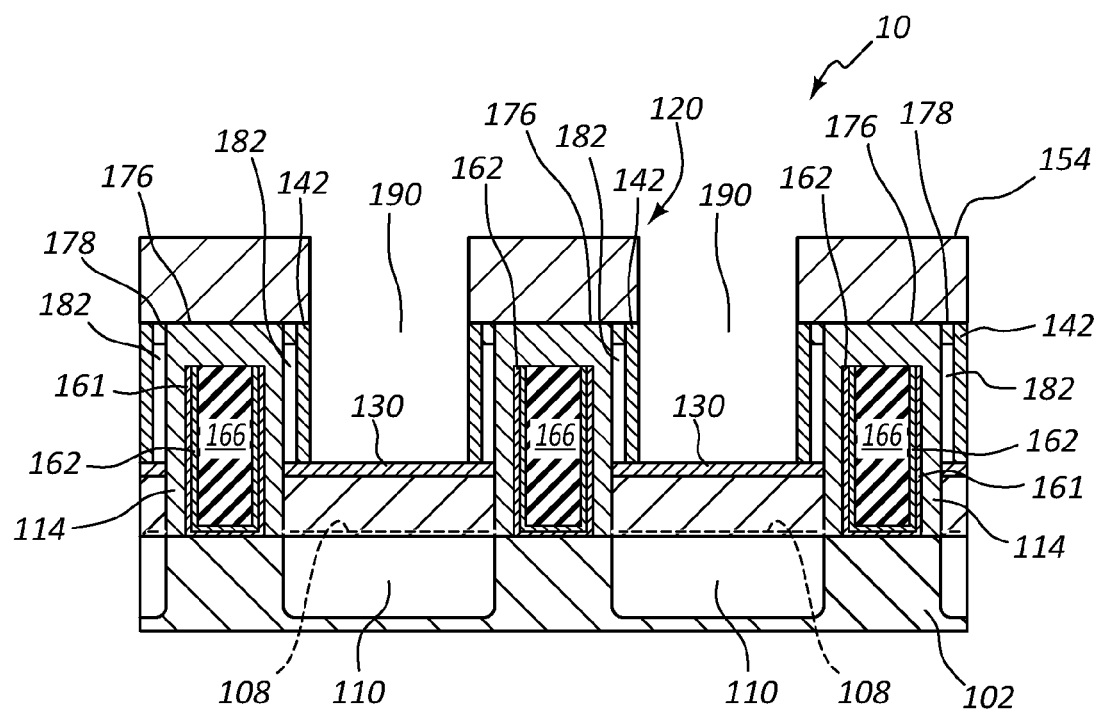
FIG. 13 is a cross sectional view of a semiconductor structure in an intermediary stage of fabrication after removal of material to define a contact hole.

Referring to FIG. 13, FIG. 13 illustrates the semiconductor structure 10 as shown in FIG. 12 after removal of a portion of material of layer 154 to define contact holes 190. It was observed in the development of methods and apparatus herein that without layer 130, source/drain region 110 can become gouged and degraded during removal of material from layer 154. It was observed during development of methods and apparatus herein that material forming layer 154, e.g. oxide can have improved etch selectively to material of layer 130 relative to material forming source/drain region 110, e.g. Si, SiGe. Layer 130 can protect source/drain region 110 and can reduce a likelihood of gouging of source/drain region 110 during removal of material from layer 154.

Figure 14:
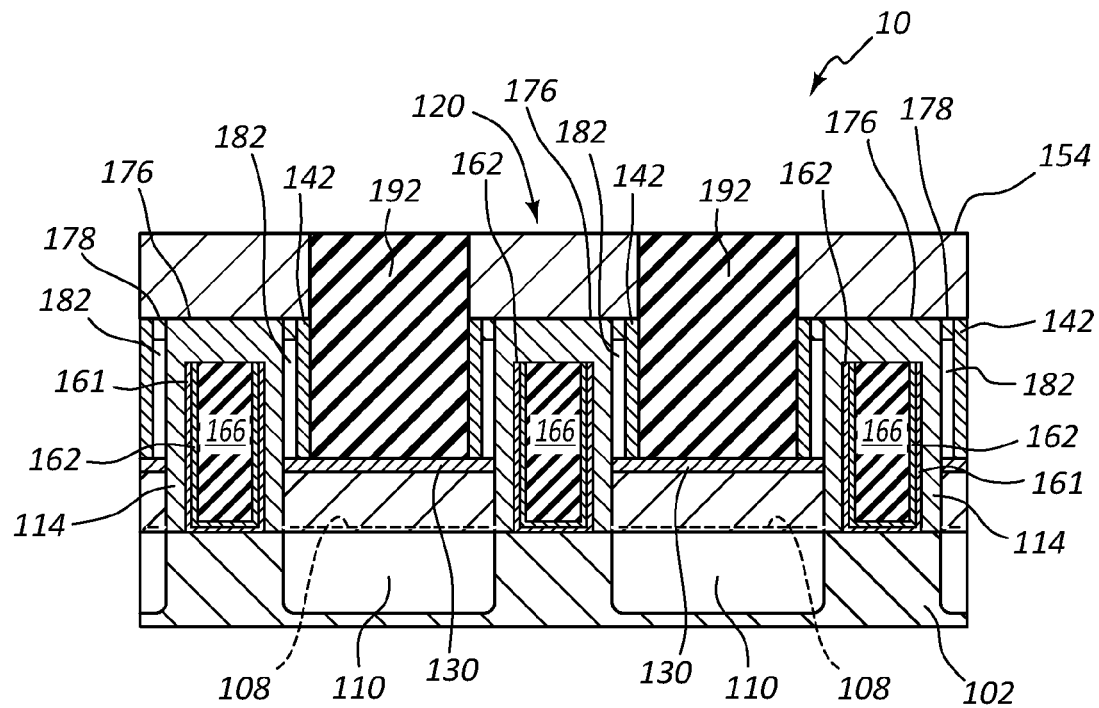
FIG. 14 is a cross sectional view of a semiconductor structure in an intermediary stage of fabrication after formation of material within contact holes.

Referring to FIG. 14, FIG. 14 illustrates the semiconductor structure 10 as shown in FIG. 13 after formation of conductive material formations 192 in holes 190. Formations 192 can be provided by e.g., tungsten (W) or aluminum (Al).

Further referring to FIG. 14, FIG. 14 illustrates a first process for fabricating contacts using semiconductor structure 10 as shown in the intermediary fabrication stage of FIG. 13. A second method for fabricating contacts on a semiconductor structure 10 using the semiconductor structure 10 as shown in the intermediary fabrication stage of FIG. 13 is described with reference to FIG. 15.

Figure 15:
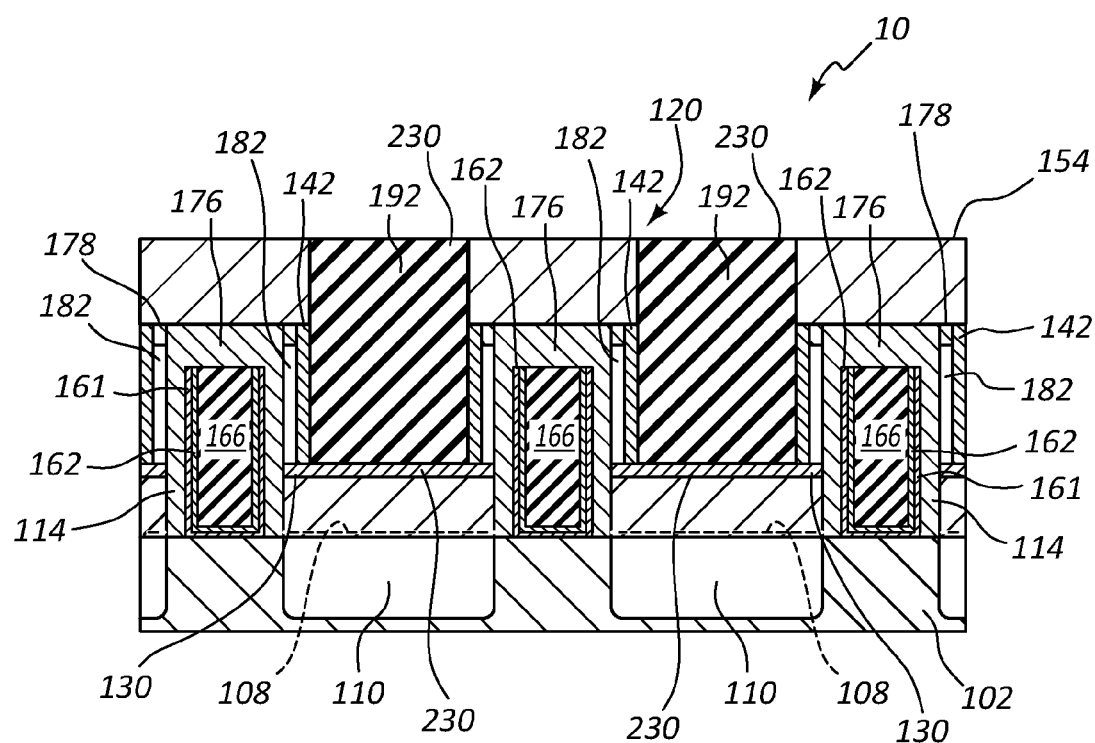
FIG. 15 is a cross sectional view of a semiconductor structure in an intermediary stage of fabrication after formation of material within contact holes.

Referring FIG. 15, sections of layer 130 at bottom of holes 190 can be removed according to an alternate contact fabrication process. Further with reference to FIG. 15, after removal of sections of material from layer 130, layer 230 can be formed in holes 190 (FIG. 13). Layer 230 can be formed on and adjacent to layer 230 source/drain regions 110 and can be formed of a metallic material different from a metallic material forming layer 130.

The process described in reference to FIG. 15 can be used in place of the process described with reference to FIG. 14 where it is desired that a different metallic material be in contact with source/drain region 110.

Semiconductor structure 10 can be fabricated so that an n compatible material (provided by the material of first layer 130 or layer 230) is formed on source/drain regions 110 that are n type. Semiconductor structure 10 can further be fabricated so that p compatible material (provided by the material of second of layer 130 or layer 230) can be formed on source/drain regions 110 that are p type.

Figure 16:
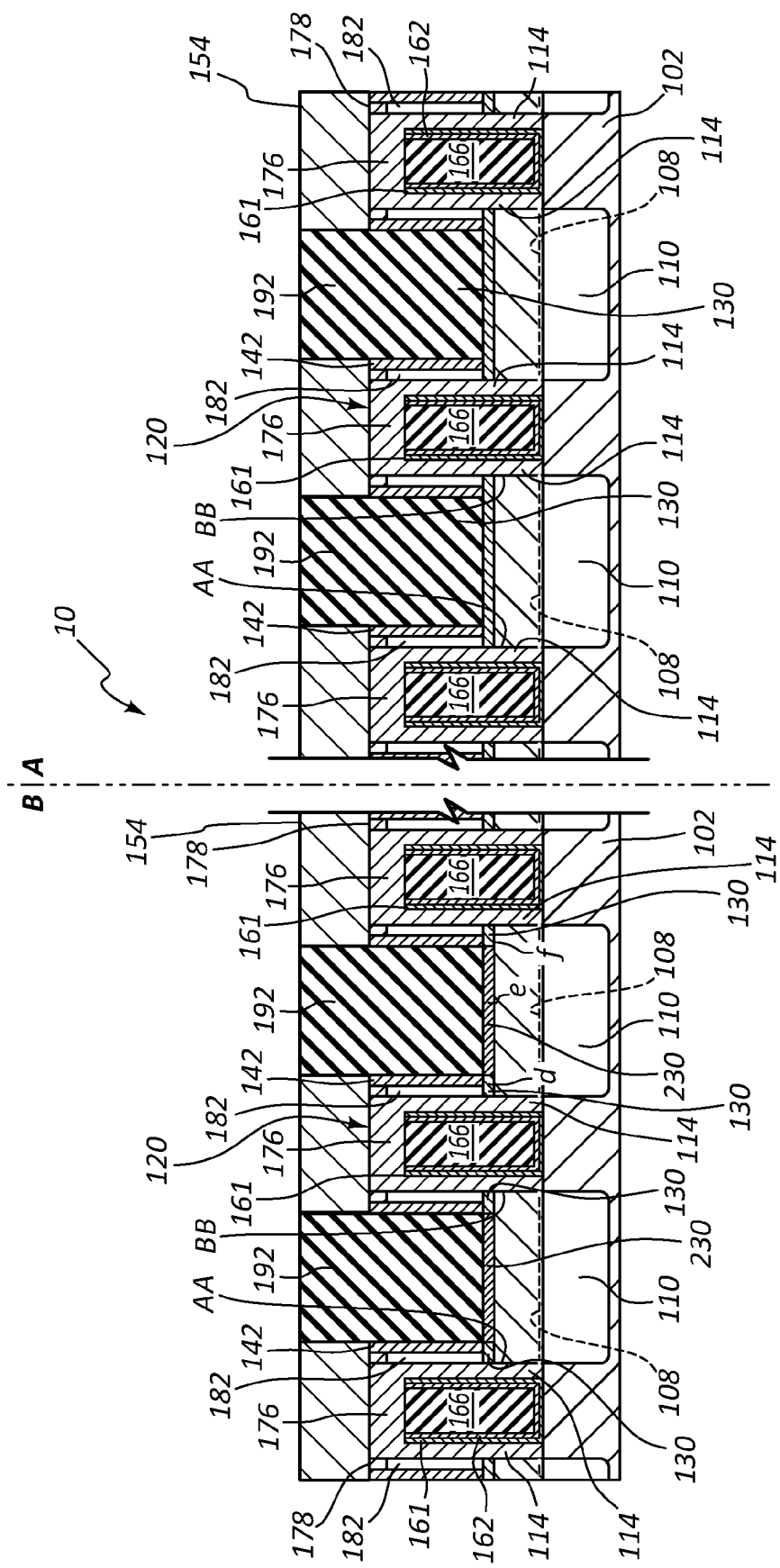
FIG. 16 is a cross sectional view of a semiconductor structure in an intermediary stage of fabrication after formation of first and second regions having different contact configurations.

Referring to FIG. 16, each of the fabrication process described with reference to FIG. 14 and with reference to FIG. 15 can be performed using a single semiconductor structure 10 having a single substrate 102.

Referring to FIG. 16, semiconductor structure 10 can include region A and region B. A contact formation method described with reference to 15 can be used in region A of semiconductor structure 10 as shown in FIG. 16 and the contact formation process described with reference to 14 can be used in region B of the structure 10 as shown in FIG. 16.

In one embodiment layer 130 can be formed of n compatible material and layer 230 can be formed of p compatible material. In such an embodiment, source/drain regions 110 of region A can be n type source/drain regions, and source/drain regions 110 of region B can be p type source/drain regions.

In one embodiment layer 130 can be formed of p compatible material and layer 230 can be formed of n compatible material. In such an embodiment, source/drain regions 110 of region A can be p type source/drain regions, and source/drain regions 110 of region B can be n type source/drain regions.

An n compatible material herein can have a relatively low work function. Examples of n compatible material include, e.g., titanium (Ti), Aluminum (Al) and erbium (Er). A p compatible material herein can have a relatively high work function. Examples of p compatible material include, e.g., platinum (Pt) and nickel platinum (NiPt).

Methods set forth herein can reduce a contact resistance between a source/drain region 110 and a contact formation 192. Referring to region A and B of FIG. 16 a metallic material formation formed on source/drain region 110 can extend from a first spacer 114 of a first gate 120 at location AA to an opposing spacer 114 at location BB of a second gate 120. The providing of a metallic material formation that extends from a first spacer 114 of a first gate 120 to an opposing spacer 114 of a second gate 120 can reduce contact resistance. In region A such metallic material formation can be provided by layer 130. In region B such metallic material formation can be provided by first and second sections of layer 130 (location d and f) and a section of layer 230 (location e).

Each of the deposited layers as set forth herein, e.g., layer 114, layer 130, layer 142, layer 152, layer 162, layer 166, layer 176, layer 178, and layer 230, can be deposited using any of a variety of deposition processes, including, for example, physical vapor deposition (PVD), atomic layer deposition (ALD), chemical vapor deposition (CVD), sputtering, or other known processes, depending on the material composition of the layer.

In one example, a protective mask layer as set forth herein, e.g., a mask layers for patterning layer 142 and layer 152 and layer 130 and layer 116, layer 162, layer 166, layer 176, layer 178 and layer 154 as set forth herein may include a material such as, for example, silicon nitride, silicon oxide, or silicon oxynitride, and may be deposited using conventional deposition processes, such as, for example, CVD or plasma-enhanced CVD (PECVD). In other examples, other mask materials may be used depending upon the materials used in semiconductor structure. For instance, a protective mask layer may be or include an organic material. For instance, flowable oxide such as, for example, a hydrogen silsesquioxane polymer, or a carbon-free silsesquioxane polymer, may be deposited by flowable chemical vapor deposition (F-CVD). In another example, a protective mask layer may be or include an organic polymer, for example, polyacrylate resin, epoxy resin, phenol resin, polyamide resin, polyimide resin, unsaturated polyester resin, polyphenylene ether resin, polyphenylenesulfide resin or benzocyclobutene (BCB).

Removing material of a layer as set forth herein, e.g., layer 152, layer 162, layer 166, layer 130, layer 176, layer 178, layer 152, and layer 154 can be achieved by any suitable etching process, such as dry or wet etching processing. In one example, isotropic dry etching may be used by, for example, ion beam etching, plasma etching or isotropic RIE. In another example, isotropic wet etching may also be performed using etching solutions selective to the material subject to removal.

The terminology used herein is for the purpose of describing particular embodiments only and is not intended to be limiting of the invention. As used herein, the singular forms "a," "an," and "the" are intended to include the plural forms as well, unless the context clearly indicates otherwise. It will be further understood that the terms "comprise" (and any form of comprise, such as "comprises" and "comprising"), "have" (and any form of have, such as "has" and "having"), "include" (and any form of include, such as "includes" and "including"), and "contain" (and any form contain, such as "contains" and "containing") are open-ended linking verbs. As a result, a method or device that "comprises," "has," "includes," or "contains" one or more steps or elements possesses those one or more steps or elements, but is not limited to possessing only those one or more steps or elements. Likewise, a step of a method or an element of a device that "comprises," "has," "includes," or "contains" one or more features possesses those one or more features, but is not limited to possessing only those one or more features. Furthermore, a device or structure that is configured in a certain way is configured in at least that way, but may also be configured in ways that are not listed.

The corresponding structures, materials, acts, and equivalents of all means or step plus function elements in the claims below, if any, are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of one or more aspects of the invention and the practical application, and to enable others of ordinary skill in the art to understand one or more aspects of the invention for various embodiments with various modifications as are suited to the particular use contemplated.

What is claimed is:

1. A method comprising:
    forming a conductive metal layer over a source/drain region;
    forming a dielectric layer over the conductive metal layer;
    removing material to define a contact hole, wherein the removing includes removing material of the dielectric layer;
    using the conductive metal layer to pattern air spacers; and
    filling the contact hole with a contact metal formation.

2. The method of claim 1, wherein the forming includes forming the conductive metal layer so that the conductive metal layer extends over a first gate adjacent a first end of the source/drain region and over a second gate adjacent a second end of the source/drain region.

3. The method of claim 1, wherein the forming includes forming the conductive metal layer so that the conductive metal layer extends over a first gate adjacent a first end of the source/drain region and over a second gate adjacent a second end of the source/drain region, the conductive metal layer having a section extending from a first sidewall of the first gate to an opposing sidewall of the second gate.

4. The method of claim 1, wherein the forming includes forming the conductive metal layer so that the conductive metal layer extends over a first gate adjacent a first end of the source/drain region and over a second gate adjacent a second end of the source/drain region, the conductive metal layer having a section extending from a first sidewall of the first gate to an opposing sidewall of the second gate, the conductive metal layer having a first vertically extending section extending adjacent to the first sidewall of the first gate, the conductive metal layer including a second vertically extending section adjacent to the opposing sidewall of the second gate.

5. The method claim 4, wherein the first vertically extending section and the second vertically extending section are removed to define air spacers.

6. The method of claim 1, wherein the removing material is absent of removing material from the conductive metal layer.

7. The method of claim 1, wherein the removing material includes removing material of the conductive metal layer.

8. A semiconductor structure comprising:
  a source/drain region having a first end adjacent a first gate and a second end adjacent a second gate;
  a conductive metal layer formed on the source/drain region;
  at least one air space adjacent said first gate or second gate; and
  a contact metal formation formed above the conductive metal layer.

9. The semiconductor structure of claim 8, wherein the conductive metal layer has a section that extends from a first sidewall of the first gate to an opposing sidewall of the second gate.

10. The semiconductor structure of claim 8, wherein the conductive metal layer is formed of a first material and a second material different from the first material.

11. The semiconductor structure of claim 8, wherein, the semiconductor structure has a first air spacer adjacent the first gate and a second air spacer adjacent the second gate.

* * * * *